United States Patent
Lueng et al.

(10) Patent No.: US 9,019,665 B2
(45) Date of Patent: Apr. 28, 2015

(54) READER SENSOR, MAGNETIC HEAD, HEAD GIMBAL ASSEMBLY AND DISK DRIVE UNIT WITH THE SAME

(75) Inventors: Chiuming Lueng, Hong Kong (CN);
Mankit Lee, Hong Kong (CN);
Cheukwing Leung, Hong Kong (CN);
Juren Ding, Hong Kong (CN);
Rongkwang Ni, Hong Kong (CN)

(73) Assignee: SAE Magnetic (H.K.) Ltd., Hong Kong (CN)

( * ) Notice: Subject to any disclaimer, the term of this patent is extended or adjusted under 35 U.S.C. 154(b) by 1021 days.

(21) Appl. No.: 13/067,164

(22) Filed: May 12, 2011

(65) Prior Publication Data
US 2012/0287534 A1      Nov. 15, 2012

(51) Int. Cl.
*G11B 5/33*      (2006.01)
*G01R 33/00*      (2006.01)
*G01R 33/025*      (2006.01)
*G11B 5/39*      (2006.01)

(52) U.S. Cl.
CPC ........ *G11B 5/398* (2013.01); *G11B 2005/3996* (2013.01); *G01R 33/0011* (2013.01); *G01R 33/0017* (2013.01); *G01R 33/025* (2013.01); *G11B 5/3912* (2013.01); *G11B 5/3932* (2013.01)

(58) Field of Classification Search
CPC .............................................. G11B 2005/3996
USPC ........... 360/327.2, 327.23, 327.24, 327, 319, 360/313, 324.12, 110
See application file for complete search history.

(56) References Cited

U.S. PATENT DOCUMENTS

| | | | | |
|---|---|---|---|---|
| 4,987,508 | A | * | 1/1991 | Smith ...................... 360/327.23 |
| 8,154,825 | B2 | * | 4/2012 | Takashita et al. ........ 360/125.71 |
| 8,422,177 | B2 | * | 4/2013 | Fernandez-de-Castro ... 360/319 |
| 2009/0180217 | A1 | * | 7/2009 | Chou et al. .................... 360/324 |

FOREIGN PATENT DOCUMENTS

JP      06215335 A  *  8/1994  ............... G11B 5/39

* cited by examiner

*Primary Examiner* — Julie Anne Watko
(74) *Attorney, Agent, or Firm* — Nixon & Vanderhye, P.C.

(57) ABSTRACT

A reader sensor comprises a first shielding layer, a second shielding layer, a read element formed therebetween, and a pair of permanent magnet layer respectively placed on two sides of the read element; and it further comprises a magnetic field generating means formed beside the read element and arranged for providing a magnetic field with a direction perpendicular to the first shielding layer and the second shielding layer, thereby stabilizing the reading performance of the reader sensor. The invention can stabilize the reading performance, ameliorate the unstable defective reader sensor, and decrease the waste and the manufacturing cost. The present invention also discloses a magnetic head, a HGA and a disk drive unit.

16 Claims, 14 Drawing Sheets

READER SENSOR, MAGNETIC HEAD, HEAD GIMBAL ASSEMBLY AND DISK DRIVE UNIT WITH THE SAME

FIELD OF THE INVENTION

The present invention relates to information recording disk drive devices and, more particularly to a reader sensor for stabilizing the reading performance, a magnetic head, and a head gimbal assembly (HGA) and disk drive unit with the same.

BACKGROUND OF THE INVENTION

Hard disk drive incorporating rotating magnetic disks is commonly used for storing data in the magnetic media formed on the disk surfaces, and a movable slider including reader sensors are generally used to read data from tracks on the disk surfaces.

Figure 1A:
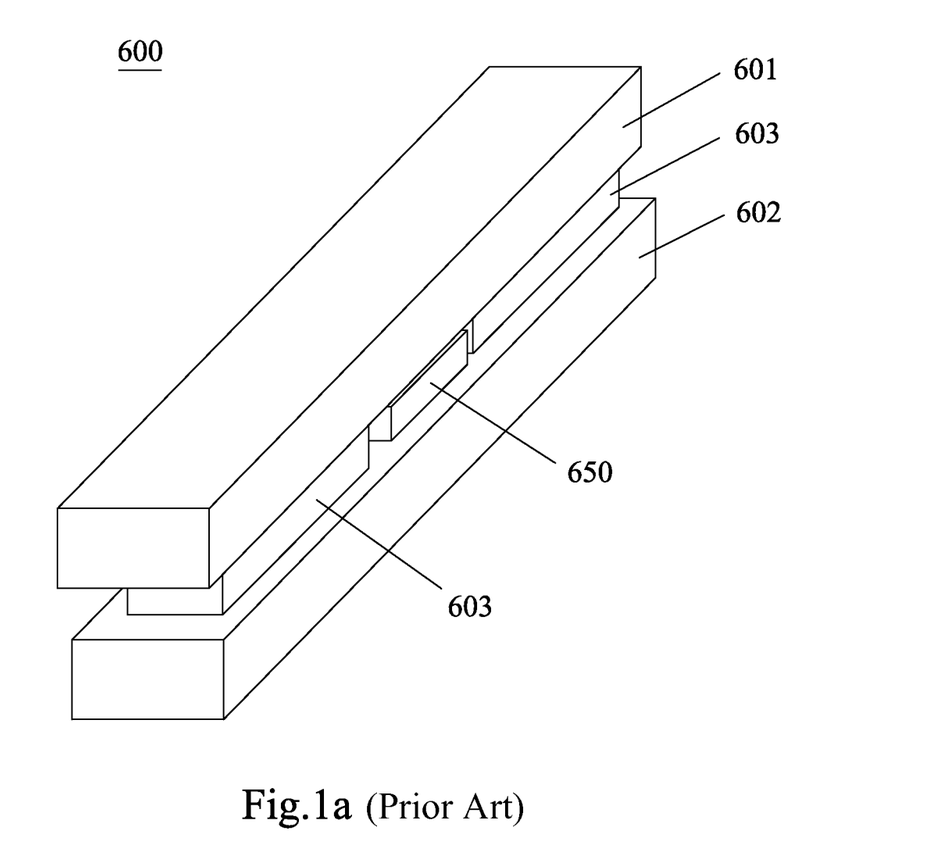
FIG. 1a is a simplified and partial perspective view of a conventional reader sensor.
Figure 1B:
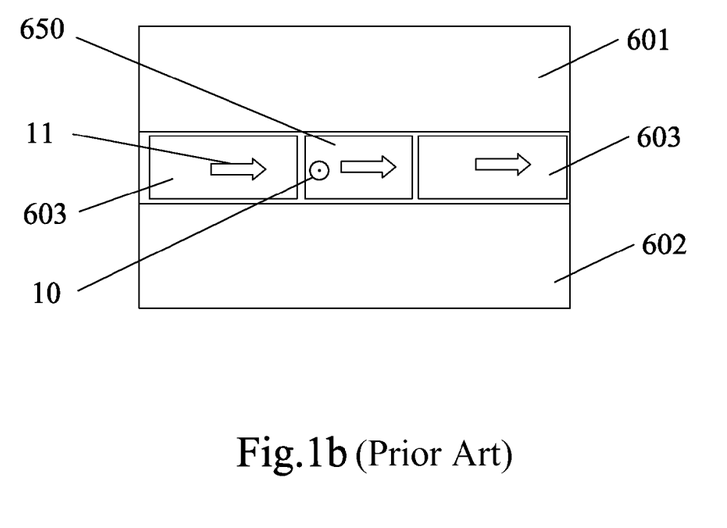
FIG. 1b is a schematic view of the reader sensor shown in FIG. 1a, and seen from ABS of a slider.

FIG. 1a is a simplified perspective view of a conventional reader sensor 600, and FIG. 1b is a schematic view of the reader sensor 600 seen from air bearing surface (ABS) (not shown) of a slider. As shown in FIGS. 1a and 1b, the reader sensor 600 includes a first shielding layer 601, a second shielding layer 602, a read element 650 formed therebetween, and a pair of permanent magnet layers 603 respectively placed on two sides of the read element 650.

Commonly, the permanent magnet layers 603 provides a longitudinal bias field to the read element 650 for stabilizing the read element 650 to some extent, which has a magnetic direction 11 parallel to the ABS. An outer signal field coming from a magnetic medium, such as a disk of a disk drive unit will be supplied to the read element 650, which has a magnetic direction 10 perpendicular to the ABS. As known, a free layer of the read element 650 having the shape anisotropy effect will rotate as a result of the outer magnetic field, thus the magnetization direction of the free layer will shift freely. Thus the longitudinal bias field with a fixed direction can stabilize the free layer to a degree.

However, this reader sensor still may be unstable for the changing external environment or the other internal elements, which will impact the reading performance of the magnetic head. If excessive and obvious noise and jumping appear during the stability testing, the magnetic head having such reader sensor will be rejected. Thus, the defective magnetic head will be abandoned as a defective product, which causes a waste and an increased manufacturing cost.

Hence, it is desired to provide an improved reader sensor to overcome the above-mentioned drawbacks.

SUMMARY OF THE INVENTION

One objective of the present invention is to provide a reader sensor which can stabilize the reading performance, ameliorate the unstable defective read element, and decrease the waste and the manufacturing cost.

Another objective of the present invention is to provide a magnetic head having a reader sensor which can stabilize the reading performance, ameliorate the unstable defective read element, and decrease the waste and the manufacturing cost.

Yet another objective of the present invention is to provide a HGA having a reader sensor which can stabilize the reading performance, ameliorate the unstable defective read element, and decrease the waste and the manufacturing cost.

A further objective of the present invention is to provide a disk drive unit having a reader sensor which can stabilize the reading performance, ameliorate the unstable defective read element, and decrease the waste and the manufacturing cost.

To achieve the above objectives, a reader sensor of the invention comprises a first shielding layer, a second shielding layer, a read element formed therebetween, and a pair of permanent magnet layer respectively placed on two sides of the read element; and it further comprises a magnetic field generating means formed beside the read element and arranged for providing a magnetic field with a direction perpendicular to the first shielding layer and the second shielding layer, thereby stabilizing the reading performance of the reader sensor.

Preferably, the read element comprises a front surface forming an ABS, a back surface opposite to the front surface, a top surface and a bottom surface opposite to the top surface.

More preferably, the magnetic field generating means is formed at a side of the top surface and/or the bottom surface, and sandwiched between the first and the second shielding layers.

More preferably, the magnetic field generating means is formed at a side of the back surface and sandwiched between the first and the second shielding layers.

As one preferable embodiment, the magnetic field generating means comprises at least one permanent magnet.

Preferably, the permanent magnet has a coercive force differing from that of the permanent magnet layer.

As another preferable embodiment, the magnetic field generating means comprises at least one electromagnet.

As one more preferable embodiment, the magnetic field generating means comprises at least one electrical wire.

A magnetic head of the invention comprises a reader sensor and a write head formed on the reader sensor, the reader sensor comprising a first shielding layer, a second shielding layer, a read element formed therebetween, and a pair of permanent magnet layer respectively placed on two sides of the read element, and the reader sensor further comprises a magnetic field generating means formed beside the read element and arranged for providing a magnetic field with a direction perpendicular to the first shielding layer and the second shielding layer, thereby stabilizing the reading performance of the reader sensor.

Preferably, the read element comprises a front surface forming an ABS, a back surface opposite to the front surface, a top surface and a bottom surface opposite to the top surface.

More preferably, the magnetic field generating means is formed at a side of the top surface and/or the bottom surface, and sandwiched between the first and the second shielding layers.

More preferably, the magnetic field generating means is formed at a side of the back surface and sandwiched between the first and the second shielding layers.

As one preferable embodiment, the magnetic field generating means comprises at least one permanent magnet.

Preferably, the permanent magnet has a coercive force differing from that of the permanent magnet layer.

As another preferable embodiment, the magnetic field generating means comprises at least one electromagnet.

As one more preferable embodiment, the magnetic field generating means comprises at least one electrical wire.

A HGA of the invention comprises a slider with a magnetic head, and a suspension to support the slider, the magnetic head comprising a reader sensor and a write head formed on the reader sensor, and the reader sensor comprises a first shielding layer, a second shielding layer, a read element formed therebetween, and a pair of permanent magnet layer respectively placed on two sides of the read element. The reader sensor further comprises a magnetic field generating means formed beside the read element and arranged for providing a magnetic field with a direction perpendicular to the first shielding layer and the second shielding layer, thereby stabilizing the reading performance of the reader sensor.

A disk drive unit of the invention comprises a HGA with a slider, a drive arm to connect with the HGA, a rotatable disk, and a spindle motor to spin the disk. The slider has a reader sensor comprising a first shielding layer, a second shielding layer, a read element formed therebetween, and a pair of permanent magnet layer respectively placed on two sides of the read element, and the reader sensor further comprises a magnetic field generating means formed beside the read element and arranged for providing a magnetic field with a direction perpendicular to the first shielding layer and the second shielding layer, thereby stabilizing the reading performance of the reader sensor.

In comparison with the prior art of the reader sensor, as the magnetic field generating means is formed beside the read element and provides a biasing magnetic field with a direction perpendicular to the first and the second shielding layers to the read element, moreover the direction can be changed to flow from the first shielding layer to the second shielding layer, or flow from the second shielding layer to the first shielding layer, thereby this biasing magnetic field can stabilize the read element, and stabilize reading performance of the reader sensor finally, ameliorate the unstable defective read element to be a non-defective reader sensor, which decreases the waste and the manufacturing cost.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Various preferred embodiments of the invention will now be described with reference to the figures, wherein like reference numerals designate similar parts throughout the various views. As indicated above, the invention is directed to a reader sensor. The reader sensor has a magnetic field generating means formed beside the read element and providing a biasing magnetic field with a direction perpendicular to the first and the second shielding layers to the read element, which can stabilize the reading performance of the read element, ameliorate the unstable defective read element, and decrease the waste and the manufacturing cost.

Several example embodiments of a reader sensor for a magnetic head of a HGA of a disk drive unit will now be described. It is noted that the reader sensor may be implemented in any suitable HGA and/or disk drive device having such a reader sensor having the above-mentioned advantages. That is, the invention may be used in any suitable device having a MR sensor in any industry.

The conventional magnetic head for a slider typically includes a read portion for reading data from the disk, and a write portion for writing data into the disk. The read portion is generally formed by a reader sensor, such as Current Perpendicular to Plane (CPP) sensor, Current In Plane (CIP) sensor, tunnel magnetoresistive (TMR) sensor, giant magnetoresistive (GMR), or anisotropic magnetoresistive (AMR). For being understood well, the present description only concentrates on the embodiment of the CPP-TMR sensor. Obviously, the persons ordinarily skilled in the art can understand the application of the present invention on the other sensors after reading the following description. Now, a detailed description of the slider with the reader sensor according to a preferred embodiment of the present invention will be illustrated as following.

Figure 2:
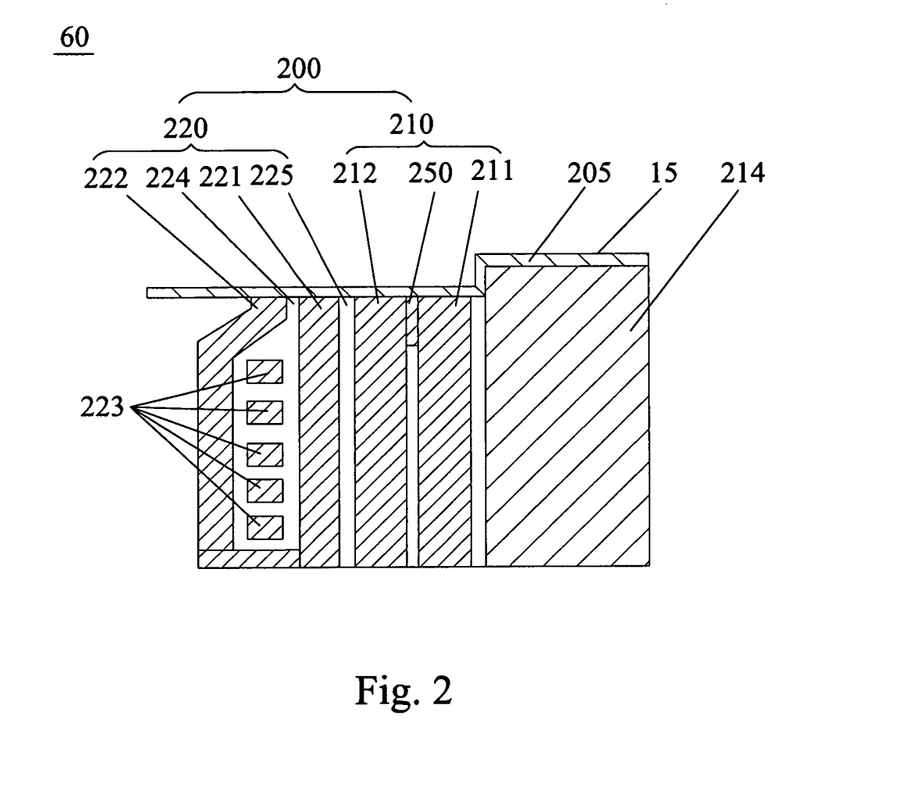
FIG. 2 is a cross-section view of a slider with a magnetic head according to an embodiment of the present invention.

FIG. 2 is a cross-section view of the slider 60 according to an embodiment of the present invention. The slider 60 is lapped to form an ABS 15 being spaced from a surface of a rotating disk 10 (referring to FIG. 10) by air bearing. The slider 60 includes a substrate 214 and a magnetic head 200 formed on the substrate 214 for reading or writing data. Concretely, the magnetic head 200 includes a reader sensor 210 formed on the substrate 214 and a write head 220 formed on the reader sensor 210. The reader sensor 210 includes a first shielding layer 211 formed on the substrate 214, a second shielding layer 212, and a read element 250 sandwiched between the first shielding layer 211 and the second shielding layer 212. The write head 220 includes a first write pole 221, a second write pole 222, coils 223 and an insulation layer 224 sandwiched between the first and second write pole 221, 222. All of the surfaces of the elements, namely the surfaces facing the ABS 15, are covered by an overcoat 205 so as to prevent or decrease the slider erosion. A gap layer 225 is formed between the second shielding layer 212 of the reader sensor 210 and the first write pole 221.

During writing, signal current is conducted through the coils 223 and flux is induced into the first and second write pole 221, 222, which causes flux to fringe across the pole tips at the ABS 15. This flux magnetizes circular tracks on the rotating disk 10 during a write operation. During a read operation, magnetized region on the rotating disk 10 injects flux into the reader sensor 210, causing the resistance of the reader sensor 210 to change. These resistance changes are detected by detecting voltage changes or current changes across the reader sensor 210.

Figure 3A:
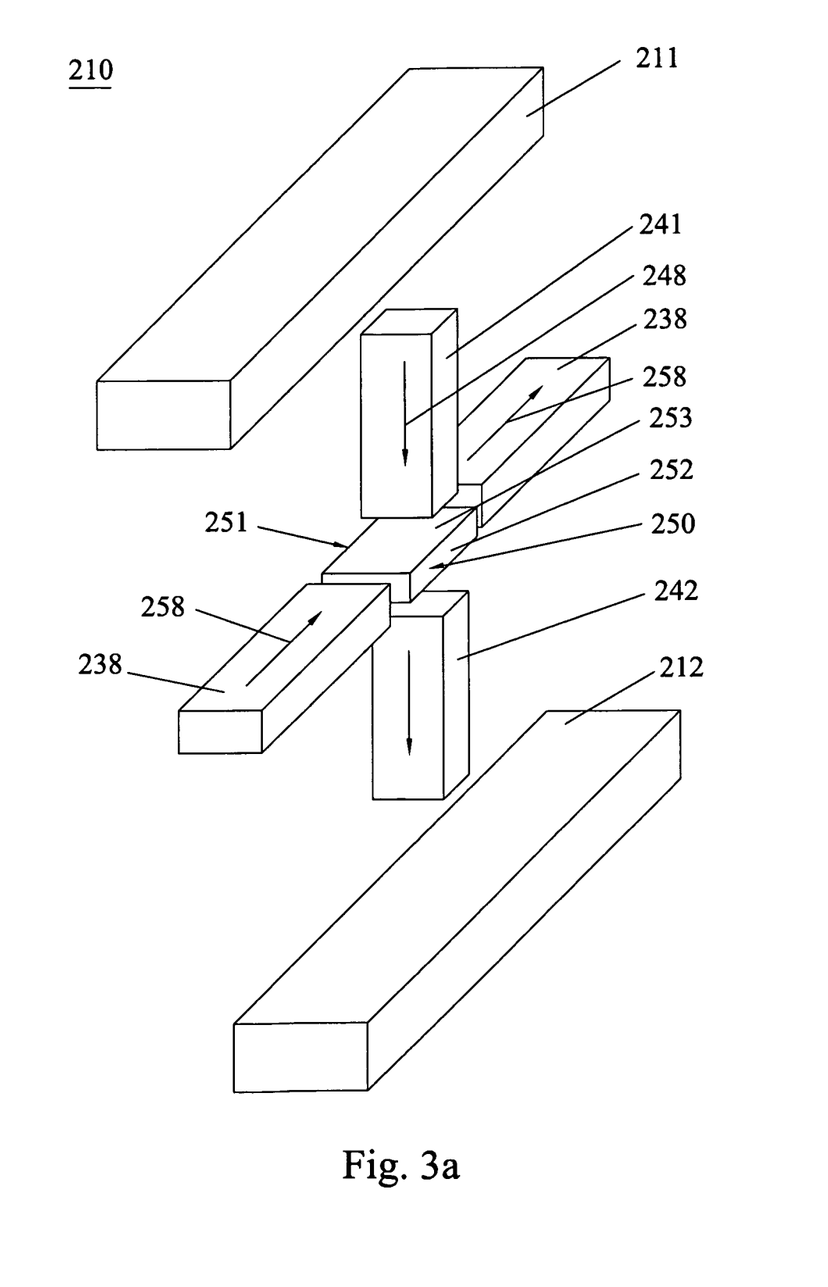
FIG. 3a is a simplified and partial perspective view of a reader sensor according to a first embodiment of the present invention.

FIG. 3a is a simplified and partial perspective view of a reader sensor 210 according to a first embodiment of the present invention. Combining with FIG. 2, the reader sensor 210 further includes a pair of permanent magnet layers 238 placed at two sides of the read element 250 for longitudinally biasing the magnetization of a free layer (not shown) thereof. The permanent magnet layers 238 can be made of a material having high coercive force such as CoPtCr alloy. Concretely, the pair of permanent magnet layers 238 has a magnetic direction indicated by arrow 258, the magnetic direction 258 orients generally parallel to the first and the second shielding layers 211, 212 and at no angle to the ABS 15.

Within the contemplation of the present invention, the reader sensor 210 further includes a magnetic field generating means formed beside the read element 250 arranged for stabilizing the read element 250. In the present embodiment, the magnetic field generating means includes two permanent magnets 241, 242. As shown in FIG. 3, the read element 250 has a front surface 251 forming the ABS 15, a back surface 252 opposite to the front surface 251, a top surface 253 and a bottom surface (not shown) opposite to the top surface 253. Concretely, the two permanent magnets 241, 242 are formed at two sides of the top surface 253 and the bottom surface respectively, and sandwiched between the first and the second shielding layers 211, 212. More concretely, a connecting line between the two magnetic poles of each permanent magnet 241 or 242 is perpendicular to the first and the second shielding layers 211, 212. The permanent magnets 241, 242 provides a biasing magnetic field with a direction 248 passing through the top surface 253 of the read element 250 perpendicularly, namely perpendicular to the first and second shielding layers 211, 212.

Alternatively, the direction 248 includes flowing from the first shielding layer 211 to the second shielding layer 212 or flowing from the second shielding layer 212 to the first shielding layer 211. The two directions can interconvert under outer operation. In the present embodiment, initially, the direction 248 flows from the first shielding layer 211 to the second shielding layer 212.

After abundant testing, inventors find that a nondefective magnetic head with the reader sensor has no response to the biasing magnetic field with the direction 248 perpendicular to the first and second shielding layers 211, 212 applied, but a defective magnetic head, such as a magnetic head generating obvious noise if used a high temperature condition has a significant response to the biasing magnetic field with the direction 248. Concretely, for a defective reader sensor with unstable reading performance, an outer operation can be processed to the permanent magnets 241, 242, so as to change the flowing direction 248. After this operation, the permanent magnet 241, 242 provides a biasing magnetic field that flows from the second shielding layer 212 to the first shielding layer 211, perpendicular to the shielding layers 211, 212. The magnetization with opposite magnetization direction can stabilize the reading performance of the read element 250. As a representation, the output of the reader sensor 210 is stable, there is little jumping shown on the output curve. Thus, the defective reader sensor is improved to be a non-defective reader sensor.

Vice versa, if the defective reader sensor has a biasing magnetic field with an initial direction that flows from the second shielding layer 212 to the first shielding layer 211, the direction can be changed to flow from the first shielding layer 211 to the second shielding layer 212, so as to stabilize the read element, and stabilize the reading performance finally. As a representation, the output of the reader sensor is stable, there is little jumping shown on the output curve. Thus, the defective reader sensor is changed to be a non-defective reader sensor.

In conclusion, as the permanent magnets 241, 242 is formed beside the read element 250, and provides a biasing magnetic field with a direction perpendicular to the first and the second shielding layers 211, 212, moreover the direction can be changed to flow from the first shielding layer 211 to the second shielding layer 212, or flow from the second shielding layer 212 to the first shielding layer 211, thereby stabilizing the reading performance of the reader sensor 210, ameliorating the unstable defective reader sensor to be a non-defective reader sensor, which decreases the waste and the manufacturing cost.

Preferably, the permanent magnets 241, 242 have a coercive force differing from that of the permanent magnet layers 238, so as to better control the changing of the magnetic direction of the permanent magnets 241, 242.

Alternatively, the amount of the permanent magnet can be one, which also can improve the stabilization of the read element of the reader sensor.

Figure 3B:
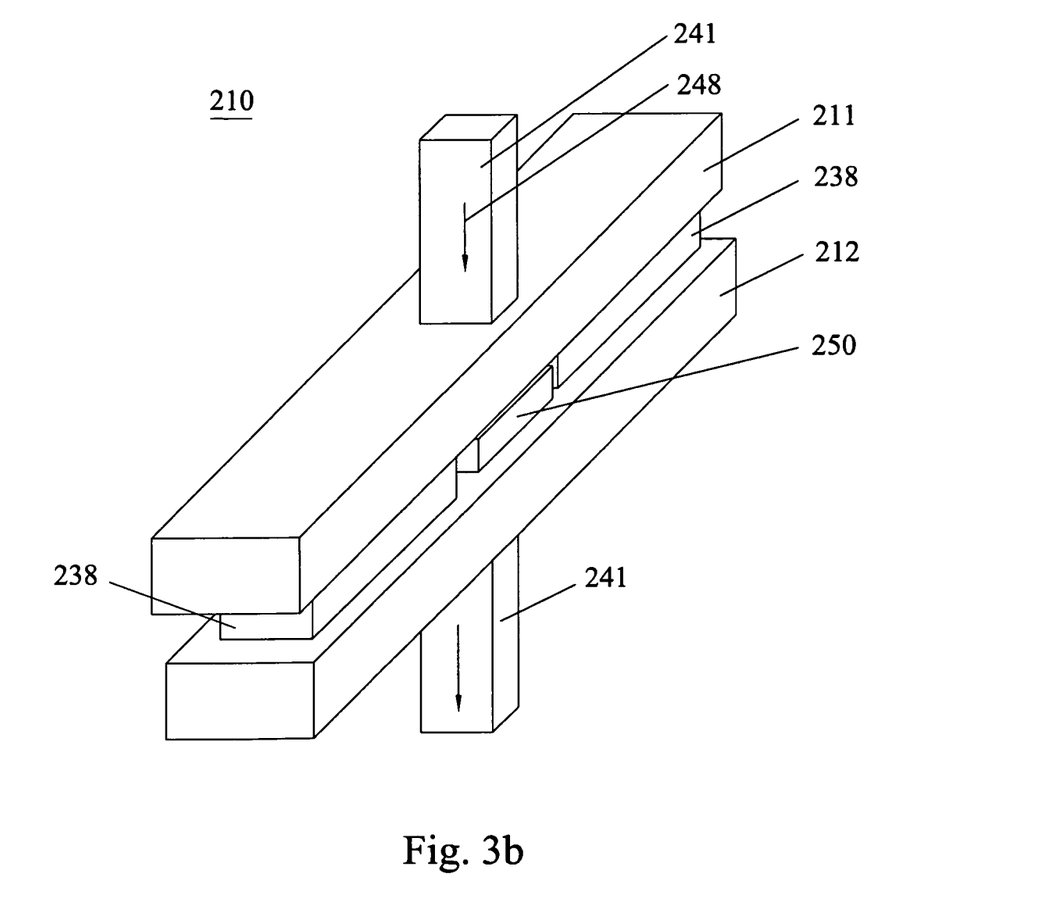
FIG. 3b is a simplified and partial perspective view of a reader sensor according to a second embodiment of the present invention.

Alternatively, the permanent magnets 241, 242 can be placed on the first and the second shielding layers 211, 212 as illustrated in FIG. 3b, which can stabilize the read element 250 as well.

Figure 4A:
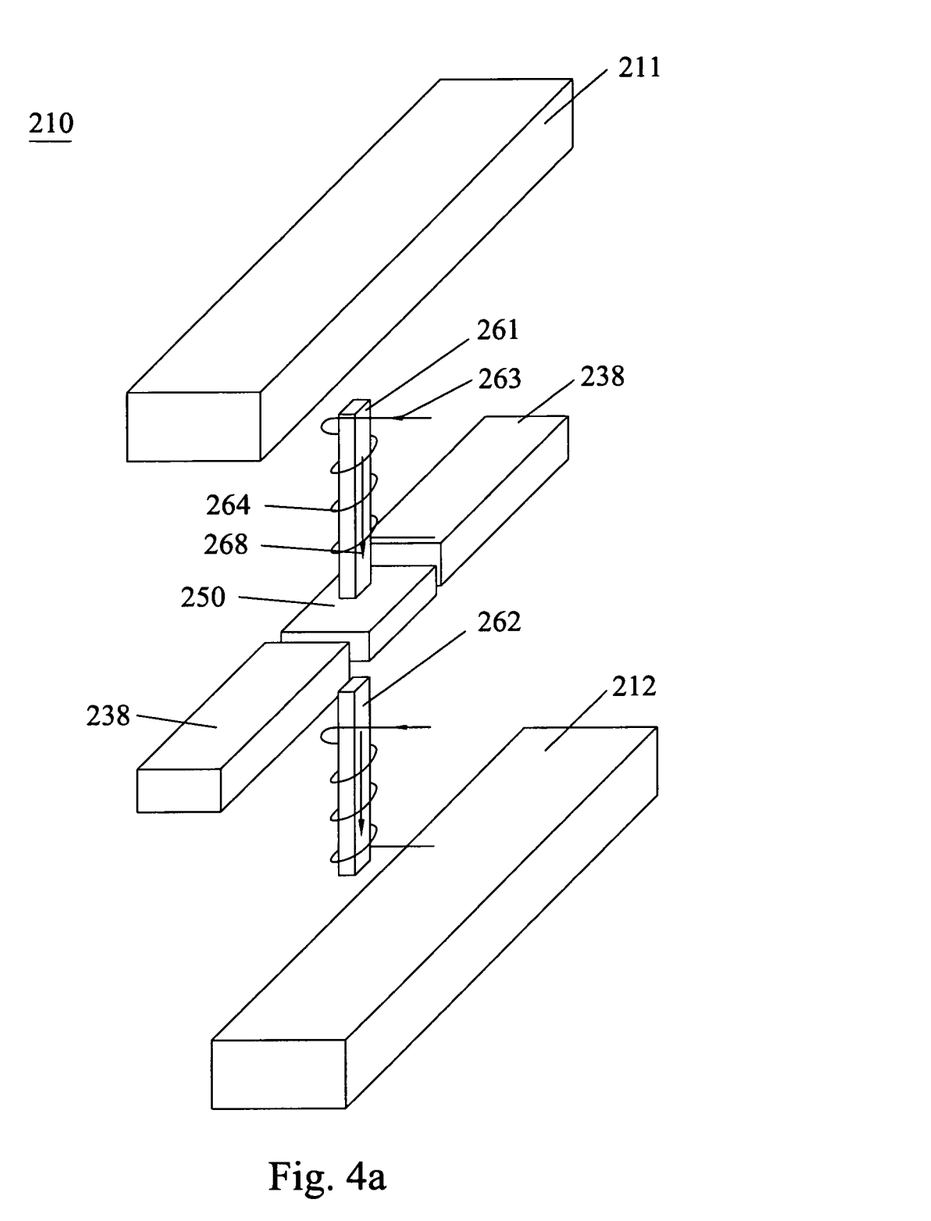
FIG. 4a is a simplified and partial perspective view of a reader sensor according to a third embodiment of the present invention.

As a preferred embodiment, the permanent magnets 241, 242 can be replaced by two electromagnets 261, 262, as shown in FIG. 4a. The position configured of the electromagnets 261, 262 is the same with that of the permanent magnets 241, 242, which the description is omitted here. Similarly, the electromagnets 261, 262 provide a biasing magnetic field with a direction 268 perpendicular to the first and the second shielding layers 211, 212. Moreover, the intensity and the direction of the magnet field can be adjusted by a current 263 provided to the coils 264.

Alternatively, the amount of the electromagnet can be one, which also can improve the stabilization of the read element of the reader sensor.

Figure 4B:
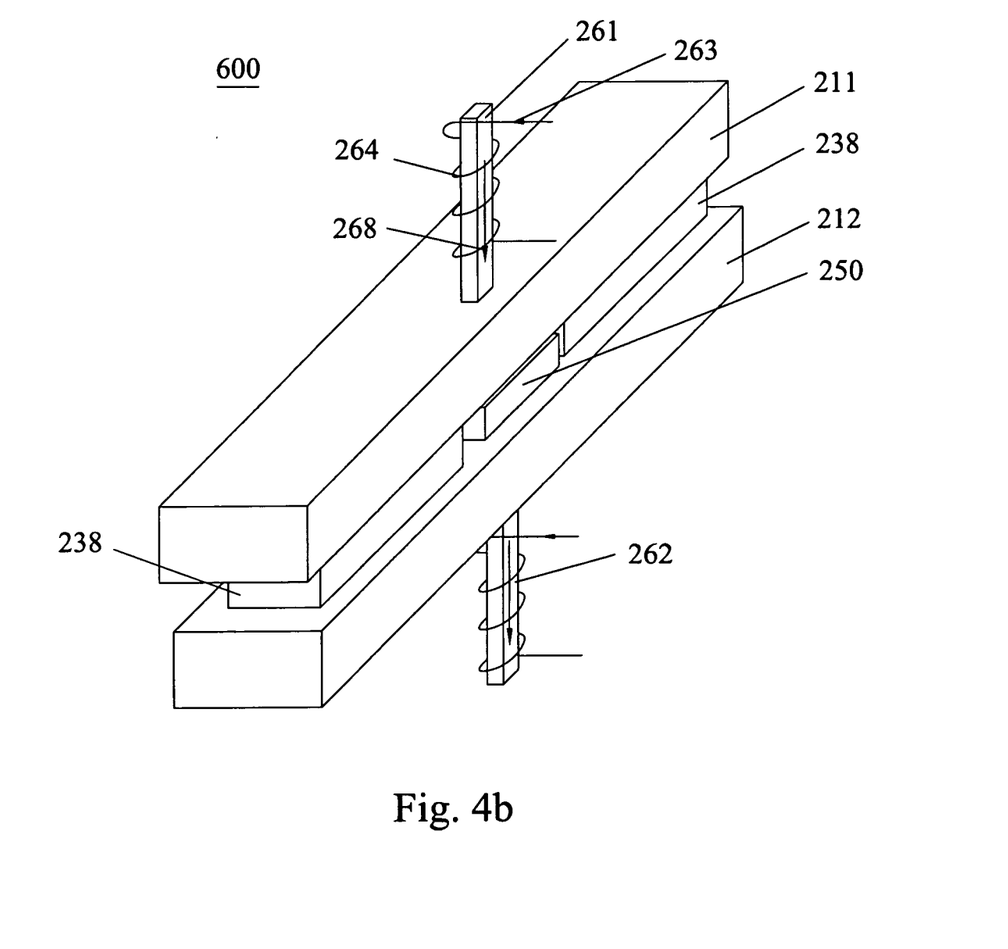
FIG. 4b is a simplified and partial perspective view of a reader sensor according to a fourth embodiment of the present invention.

Alternatively, the electromagnets 261, 262 can be placed on the first and the second shielding layers 211, 212 as illustrated in FIG. 4b, which can stabilize the read element 250 as well.

Figure 5:
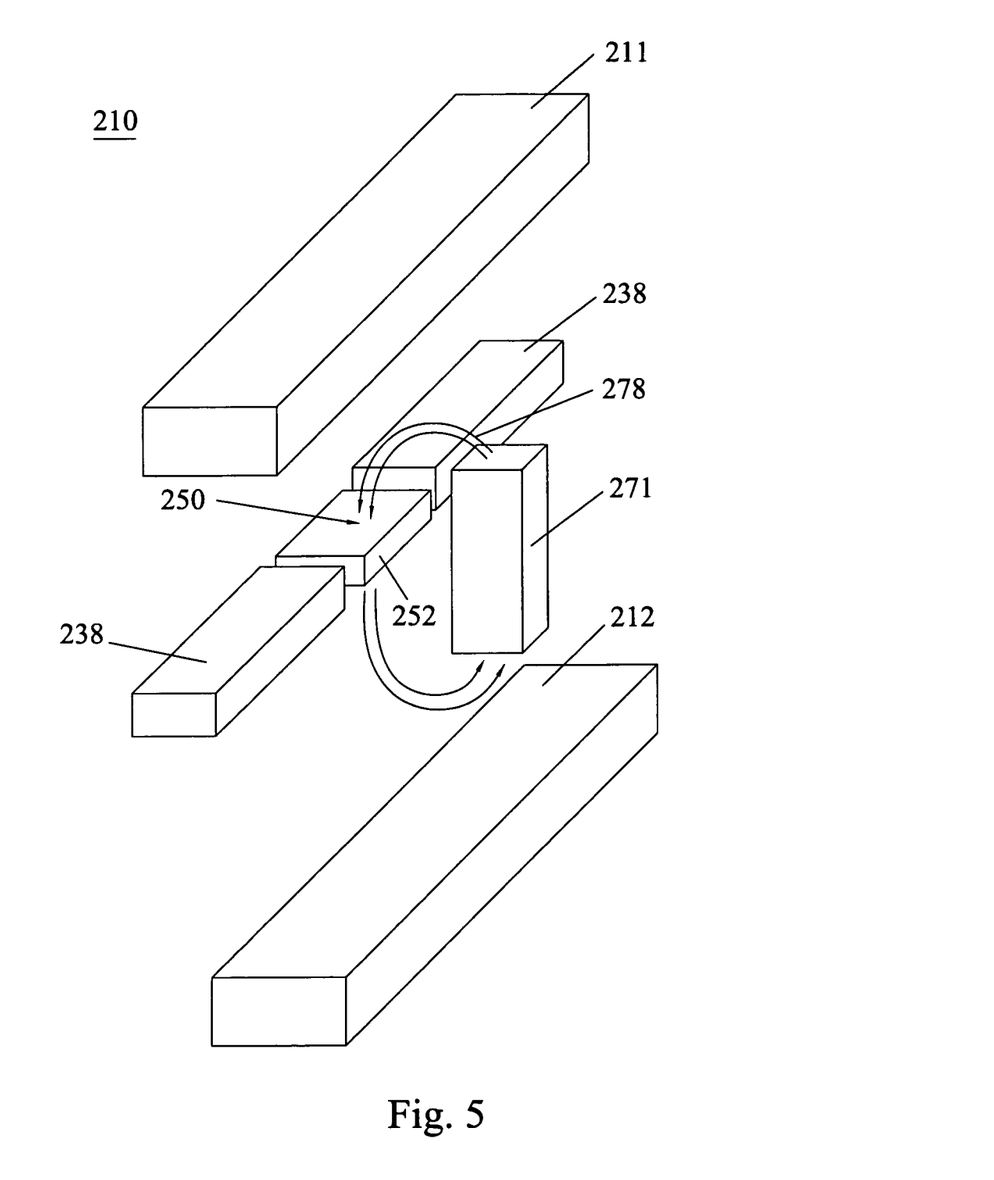
FIG. 5 is a simplified and partial perspective view of a reader sensor according to a fifth embodiment of the present invention.

FIG. 5 shows a reader sensor according to a fifth embodiment of the present invention. The magnetic field generating means includes only one permanent magnet 271, which is formed at a side of the back surface 252 of the read element 250, namely at a side far away from the ABS 15. Similarly, the permanent magnet 271 is sandwiched between the first and the second shielding layers 211, 212. As described in the first embodiment, the permanent magnet 271 also provides a biasing magnetic field with a direction 278 perpendicular to the first and the second shielding layers 211, 212 to the read element 250, that is, pass through the top surface 253 of the read element 250 perpendicularly.

Figure 6:
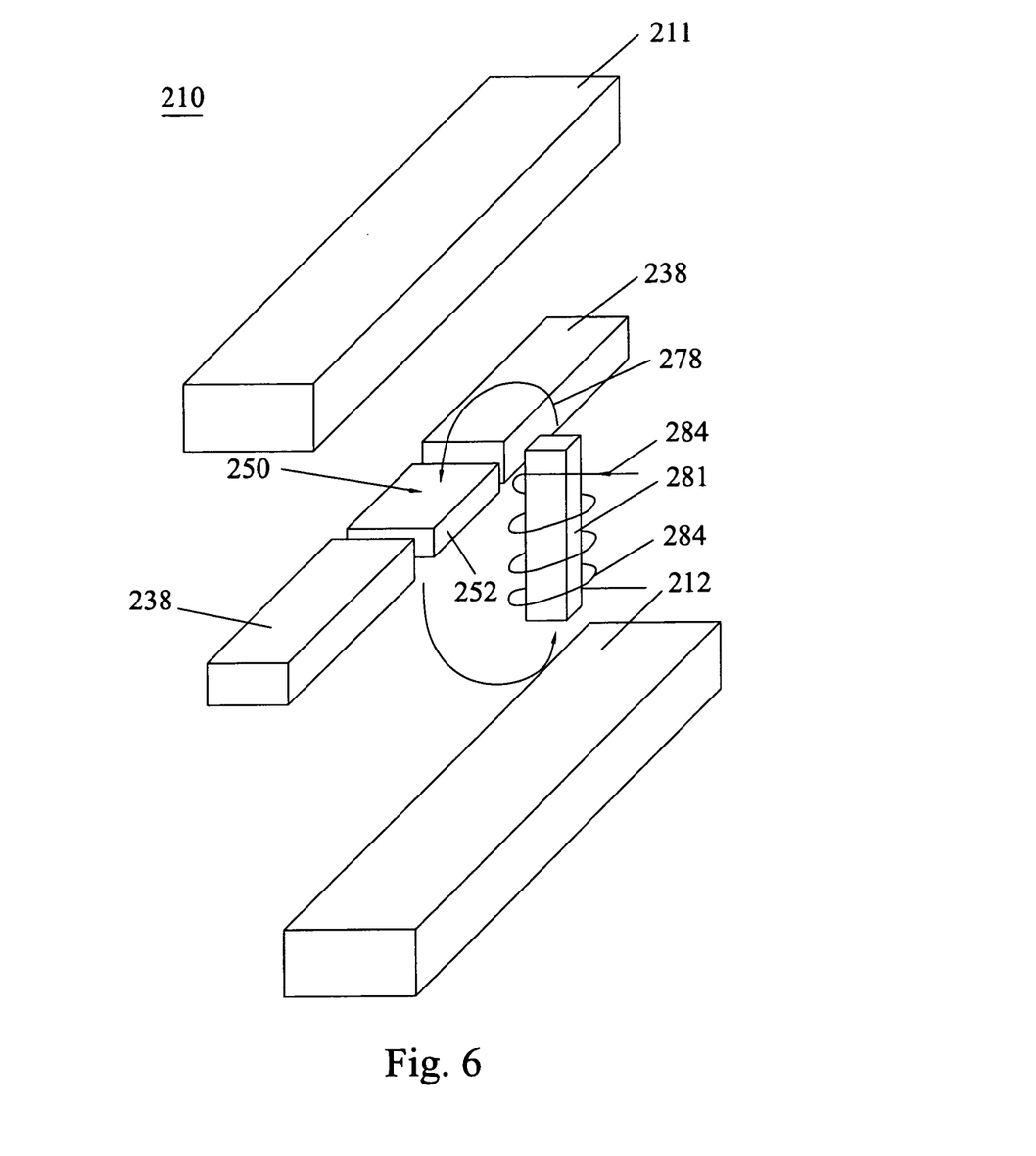
FIG. 6 is a simplified and partial perspective view of a reader sensor according to a sixth embodiment of the present invention.

FIG. 6 shows a reader sensor according to a sixth embodiment of the present invention. This embodiment is similar to the fifth embodiment; the difference is that, the permanent magnet 271 is replaced by an electromagnet 281. Similarly, the electromagnet 281 provides a biasing magnetic field with a direction 288 perpendicular to the first and the second shielding layers 211, 212. Moreover, the intensity and the direction of the magnet field can be adjusted by a current 283 provided to the coils 284.

Figure 7:
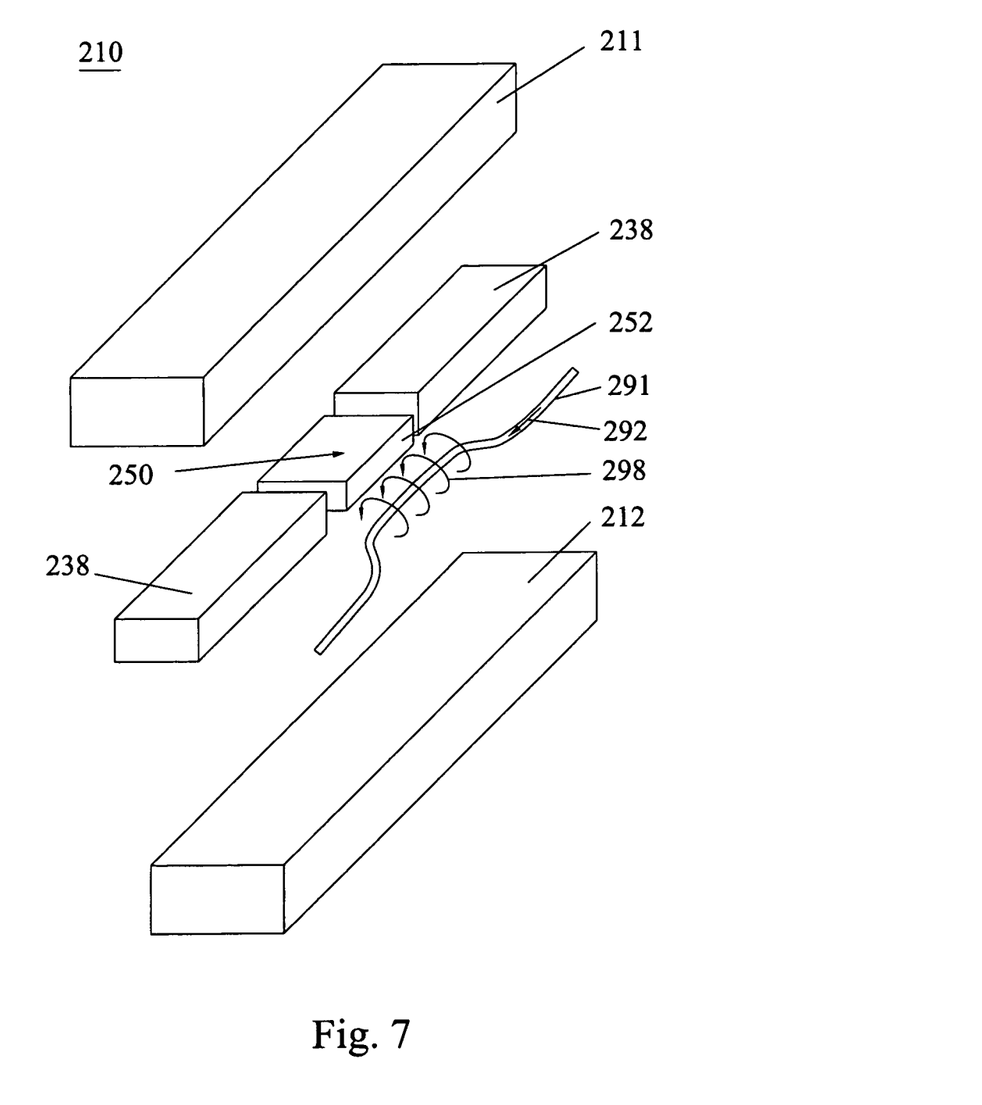
FIG. 7 is a simplified and partial perspective view of a reader sensor according to a seventh embodiment of the present invention.

Alternatively, the permanent magnet 271 can be replaced by an electrical wire 291 as shown in FIG. 7. The electrical wire 291 is formed at a side of the back surface 252 of the read element 250. When a changing current with a direction 292 is applied to the electrical wire 291, a magnetic field with a direction 298 perpendicularly passing through the top surface 251 of the read element 250 is generated. Particularly, the current direction 292 is provided along the longitudinal direction of the permanent magnet layers 238.

Figure 8:
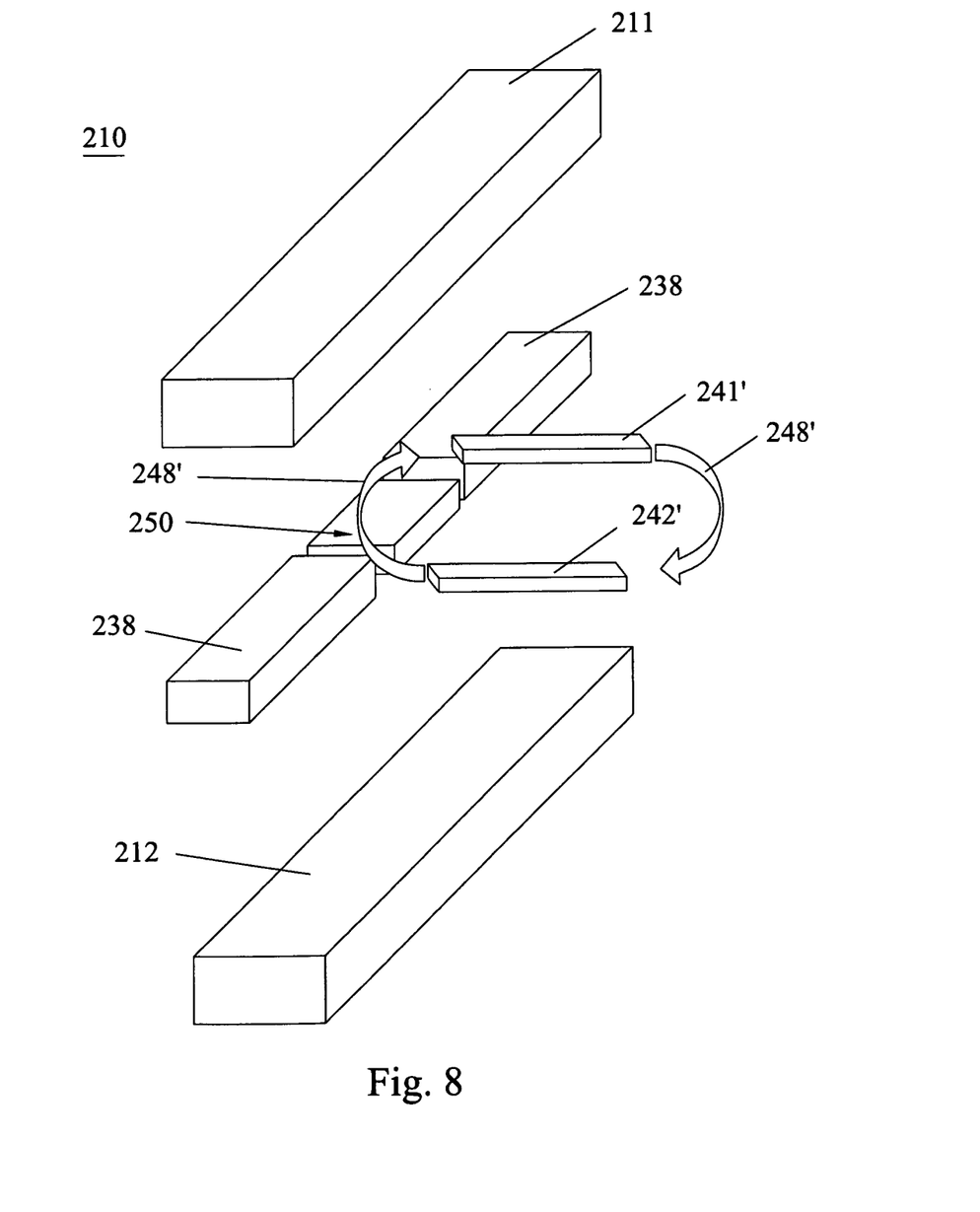
FIG. 8 is a simplified and partial perspective view of a reader sensor according to an eighth embodiment of the present invention.

Basing on the first embodiment, one more improvement design is shown in FIG. 8. In the present embodiment, two permanent magnets 241', 242' are formed beside the read element 250. The difference is that, the permanent magnets 241', 242' are formed at a side of the back surface 252 of the read element 250, and locate above the top surface 253 and the bottom surface respectively. The two permanent magnets 241', 242' are parallel to each other, and parallel to the first and the second shielding layers 211, 212. Basing on this design, the permanent magnets 241', 242' provide a biasing magnetic field with a direction 248' passing through the top surface 253 of the read element 250 perpendicularly, namely perpendicular to the first and second shielding layers 211, 212. Similarly, the present embodiment includes the similar technical features with the first embodiment, thus a same explanation is omitted here.

Figure 9:
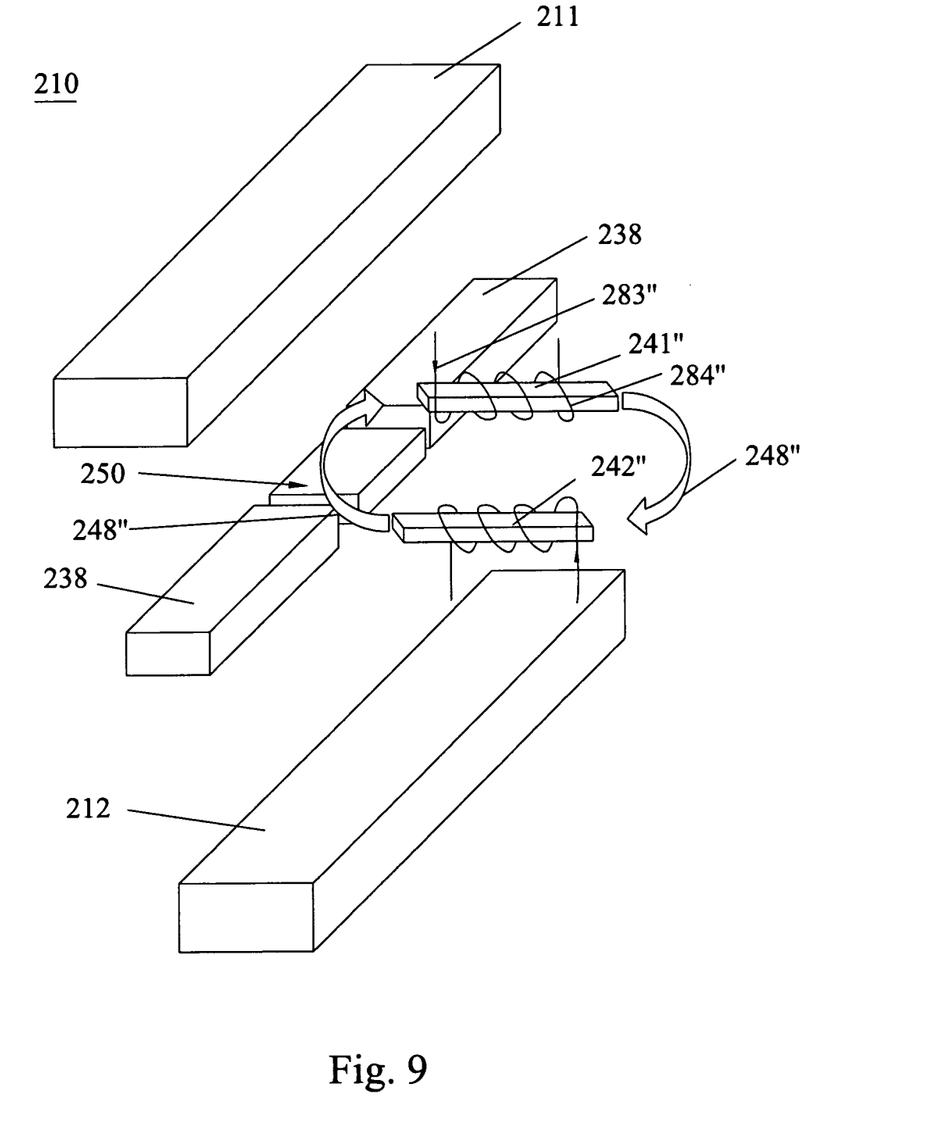
FIG. 9 is a simplified and partial perspective view of a reader sensor according to a ninth embodiment of the present invention.

As an alternative embodiment, the permanent magnets 241', 242' can be replaced by two electromagnets 241", 242", which can stabilize the read element 250 also, as shown in FIG. 9. Similarly, the electromagnet 241", 242" provide a biasing magnetic field with a direction 248" perpendicular to the first and the second shielding layers 211, 212. Moreover, the intensity and the direction of the magnet field can be adjusted by a current 283" provided to the coils 284".

The all embodiments mentioned above can provide a biasing magnetic field with a direction perpendicular to the first and the second shielding layers 211 to the read element 250, 212, moreover the direction can be changed to flow from the first shielding layer 211 to the second shielding layer 212, or flow from the second shielding layer 212 to the first shielding layer 211, thereby stabilizing the reading performance of the reader sensor, ameliorating the unstable defective reader sensor to be a non-defective reader sensor, which decreases the waste and the manufacturing cost.

Figure 10:
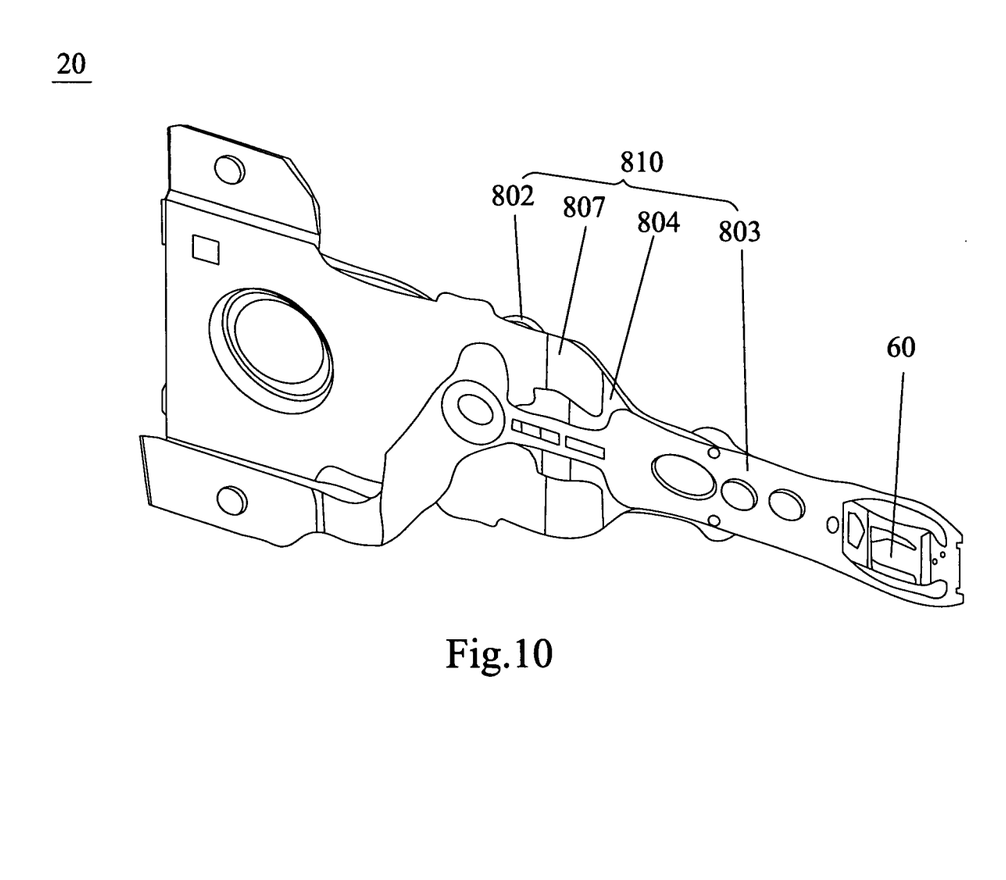
FIG. 10 is a top view of a HGA according to an embodiment of the present invention.

FIG. 10 shows a HGA 20 including the slider 60 with the reader sensor 210 described above according to an embodiment of the present invention. As shown, the HGA 20 generally includes the slider 60 described above and a suspension 801 to support the slider 60. The suspension 801 includes a base plate 802, a hinge 807, a flexure 803 and a load beam 804, all of which are assembled each other. The hinge 807 assembles the hinge 807 to the base plate 802. And the slider 60 is carried on the flexure 803. Because the structure and/or assembly process of suspension of the HGA are well known to persons ordinarily skilled in the art, a detailed description of such structure and assembly is omitted herefrom.

Figure 11:
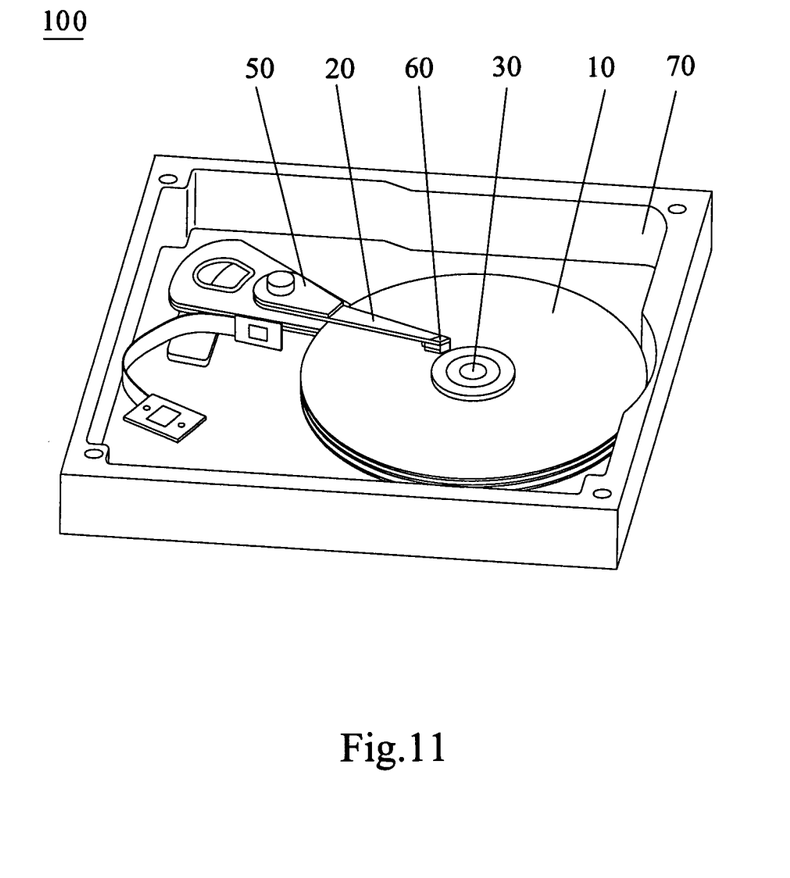
FIG. 11 is a perspective view of a disk drive unit according to an embodiment of the present invention.

FIG. 11 illustrates a disk drive unit 100 including the slider 60 and the HGA 20 according to an embodiment of the present invention. The disk drive unit 100 includes a spindle motor 30, a series of the rotatable disks 10 mounted on the spindle motor 30, the HGA 20, a drive arm 50 connected with the HGA 20, the slider 60 of the HGA 20 set at a far end of the drive arm 50 and including a reader sensor 210 (referring to FIG. 2), all of which are mounted in a housing 70. As well known to a person ordinarily skilled in the art, while the disk drive unit 100 operates, the disk 10 is rotated by the spindle motor 30, and the slider 60 will fly above the disk 10 due to the air pressure drawn by the rotated disk 10 so that the reader sensor 210 in the slider 60 may access the data tracks on disk 10.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A reader sensor, comprising:
a first shielding layer, a second shielding layer, and a read element formed therebetween;
a pair of permanent magnet layers, the permanent magnet layers being respectively placed on opposing sides of the read element; and
a magnetic field generating means formed beside the read element and arranged for providing a magnetic field with a direction perpendicular to the first shielding layer and the second shielding layer, and for stabilizing the reading performance of the reader sensor, wherein the magnetic field generating means comprises at least one permanent magnet which has a coercive force differing from that of the permanent magnet layers.

2. The reader sensor as claimed in claim 1, wherein the read element comprises a front surface forming an air bearing surface, a back surface opposite to the front surface, a top surface and a bottom surface opposite to the top surface.

3. The reader sensor as claimed in claim 2, wherein the magnetic field generating means is formed at a side of the top surface and/or the bottom surface and sandwiched between the first and the second shielding layers.

4. The reader sensor as claimed in claim 2, wherein the magnetic field generating means is formed at a side of the back surface and sandwiched between the first and the second shielding layers.

5. The reader sensor as claimed in claim 1, wherein the magnetic field generating means is formed on the first and/or the second shielding layers.

6. The reader sensor as claimed in claim 1, wherein the magnetic field generating means comprises at least one electromagnet.

7. The reader sensor as claimed in claim 1, wherein the magnetic field generating means comprises at least one electrical wire.

8. A magnetic head comprising a reader sensor and a write head formed on the reader sensor, the reader sensor comprising:
a first shielding layer,
a second shielding layer,
a read element formed therebetween,
a pair of permanent magnet layers, the permanent magnet layers being respectively placed on opposing sides of the read element; and
a magnetic field generating means formed beside the read element and arranged for providing a magnetic field with a direction perpendicular to the first shielding layer and the second shielding layer and for stabilizing the reading performance of the reader sensor, wherein the magnetic field generating means comprises at least one permanent magnet which has a coercive force differing from that of the permanent magnet layers.

9. The magnetic head as claimed in claim 8, wherein the read element comprises a front surface forming an air bearing surface, a back surface opposite to the front surface, a top surface and a bottom surface opposite to the top surface.

10. The magnetic head as claimed in claim 9, wherein the magnetic field generating means is formed at a side of the top surface and/or the bottom surface, and sandwiched between the first and the second shielding layers.

11. The magnetic head as claimed in claim 9, wherein the magnetic field generating means is formed at a side of the back surface and sandwiched between the first and the second shielding layers.

12. The magnetic head as claimed in claim 8, wherein the magnetic field generating means is formed on the first and/or the second shielding layers.

13. The magnetic head as claimed in claim 8, wherein the magnetic field generating means comprises at least one electromagnet.

14. The magnetic head as claimed in claim 8, wherein the magnetic field generating means comprises at least one electrical wire.

15. A head gimbal assembly comprising a slider with a magnetic head, and a suspension to support the slider, the magnetic head comprising a reader sensor and a write head formed on the reader sensor, and the reader sensor comprises:
   a first shielding layer,
   a second shielding layer,
   a read element formed therebetween,
   a pair of permanent magnet layers, the permanent magnet layers being respectively placed on opposing sides of the read element; and
   a magnetic field generating means formed beside the read element and arranged for providing a magnetic field with a direction perpendicular to the first shielding layer and the second shielding layer, and for stabilizing the reading performance of the reader sensor, wherein the magnetic field generating means comprises at least one permanent magnet which has a coercive force differing from that of the permanent magnet layers.

16. A disk drive unit, comprising a head gimbal assembly with a slider, a drive arm to connect with the head gimbal assembly, a rotatable disk, and a spindle motor to spin the disk; wherein the slider has a reader sensor comprising a first shielding layer, a second shielding layer, a read element formed therebetween, a pair of permanent magnet layers, the permanent magnet layers being respectively placed on opposing sides of the read element; and
   a magnetic field generating means formed beside the read element and arranged for providing a magnetic field with a direction perpendicular to the first shielding layer and the second shielding layer, and for stabilizing the reading performance of the reader sensor, wherein the magnetic field generating means comprises at least one permanent magnet which has a coercive force differing from that of the permanent magnet layers.

* * * * *